United States Patent [19]

Shreve et al.

[11] Patent Number: 4,684,877
[45] Date of Patent: Aug. 4, 1987

[54] ELECTRICAL SYSTEM UTILIZING A CONCENTRIC COLLECTOR PNP TRANSISTOR

[75] Inventors: John R. Shreve; Mark B. Kearney, both of Kokomo, Ind.

[73] Assignee: General Motors Corporation, Detroit, Mich.

[21] Appl. No.: 875,309

[22] Filed: Jun. 17, 1986

[51] Int. Cl.$^4$ .............................................. G05F 1/56
[52] U.S. Cl. ..................................... 323/269; 323/273; 363/60; 307/299 B; 357/35
[58] Field of Search ................ 307/299 B; 357/35, 36; 363/60; 323/268, 269, 273, 282

[56] References Cited

U.S. PATENT DOCUMENTS

| 3,710,269 | 1/1973 | Fowler et al. | 357/36 X |
| 4,071,778 | 1/1978 | Nakagomi | 307/299 B X |
| 4,084,174 | 4/1978 | Crippen et al. | 357/35 X |
| 4,153,909 | 5/1979 | Dobkin | 357/44 |
| 4,319,181 | 3/1982 | Wrathall | 307/299 B X |
| 4,328,509 | 5/1982 | Lehning | 357/36 |
| 4,613,809 | 9/1986 | Skovmand | 323/268 |

Primary Examiner—Patrick R. Salce
Assistant Examiner—Marc S. Hoff
Attorney, Agent, or Firm—C. R. Meland

[57] ABSTRACT

A concentric collector PNP transistor is utilized in electrical circuits to determine when the voltages of different parts of a circuit are very close to each other. The transistor has an emitter zone, an inner collector zone that surrounds the emitter zone and an outer collector zone that surrounds both the emitter zone and the inner collector zone. When the voltage of the emitter is slightly higher than the voltage of the inner collector a signal is developed at the outer collector which is used as a trigger or control signal. An oscillator-voltage doubler circuit and a series pass voltage regulator circuit are disclosed that utilize the concentric collector transistor.

9 Claims, 11 Drawing Figures

ELECTRICAL SYSTEM UTILIZING A CONCENTRIC COLLECTOR PNP TRANSISTOR

This invention relates to electrical systems that employ a concentric collector PNP transistor that operates to develop a signal at its outer collector when the voltage at its inner collector approaches the voltage of its emitter.

Lateral PNP transistors, that have multiple collectors, are known to those skilled in the art, examples being the devices disclosed in the U.S. Pat. Nos. 4,328,509 to Lehning and in the 4,153,909 to Dobkin.

In the Lehning patent a multiple collector PNP transistor is disclosed which has an emitter zone and plurality of collector zones. The collector zones do not bound or surround each other. Lehning recognizes that if a first collector zone, located adjacent the emitter zone, is open circuited a second collector zone located adjacent the first collector zone will take on a potential close to the emitter potential. This patent also recognizes that if a given collector is biased negatively it will suck up charge carriers so that the current to another collector is reduced.

The Dobkin patent discloses a multiple collector PNP transistor in FIG. 3 that has inner and outer collectors. A circuit for utilizing this transistor is shown in FIG. 8. In FIG. 8 the inner collector of the transistor is connected to a gating transistor. When the gating transistor is biased conductive current is collected by the inner collector and the outer collector has no signal current. When the gating transistor is biased nonconductive the potential of the inner collector is allowed to float. This causes the collector-to-base junction of the inner collector to saturate and re-emit signal current carriers which are collected by the outer collector.

This invention differs from the Lehning patent in that, among other things, the concentric collector transistor that is utilized in the systems of this invention has an outer collector that completely bounds or surrounds the emitter and the inner collector. This invention differs from Dobkin in that, among other things, the concentric collector transistor of this invention is so connected with electrical circuitry that it is capable of detecting a condition of operation wherein the voltage difference of first and second conductors of a circuit differ by only a small amount.

It accordingly is one of the objects of this invention to provide an electrical system wherein a concentric collector PNP transistor is so connected to the system that when a first conductor of the system, that is connected to the inner collector of the transistor, has a voltage that is slightly lower than the voltage of a second conductor of the system that is connected to the emitter of the transistor, that is, when the transistor is in saturation—a condition which occurs when the collector is less than 500 mv. from the emitter potential a signal is developed at the outer collector of the transistor of a magnitude that is high enough to trigger or actuate other circuitry. Conversely, when the voltage at the inner collector is substantially less than the voltage appearing on the emitter (i.e., when the transistor is not saturated), then no signal appears at the outer collector.

Another object of this invention is to provide an oscillator-voltage doubler circuit that utilizes a concentric collector PNP transistor for connecting a charged capacitor in series with a voltage source and for developing an output signal at its outer collector when the voltage at its inner collector is only slightly lower than the voltage of its emitter. More specifically, the oscillator-voltage doubler includes a capacitor which can be charged when a semiconductor switch is biased conductive. The emitter of the concentric collector transistor is connected to the positive terminal of a direct voltage source and its inner collector is connected to one side of the capacitor. When the concentric collector transistor is biased conductive the emitter-inner collector circuit of the transistor is utilized to connect the voltage source in series with the voltage of the capacitor to thereby provide a voltage doubling function. When the voltage at the inner collector approaches the voltage of the emitter, a signal is developed at the outer collector of the transistor that is utilized to establish a threshold voltage for a comparator that controls the charging and discharging of the capacitor. The oscillator-voltage doubler may be used to provide a gate bias voltage for a metal oxide field effect transistor but its use is not so limited.

A further object of this invention is to provide a series pass voltage regulator that utilizes a concentric collector transistor to provide a signal when the input voltage to the regulator decreases to a value that is near the output voltage of the regulator. More specifically, the emitter of the concentric collector transistor is connected to a conductor that has the input voltage applied thereto. The inner collector of the transistor is connected to the output conductor of the voltage regulator. When the input voltage drops to a value that is only slightly higher than the output voltage on the output conductor, a signal is developed at the outer collector of the transistor. This signal may be used to provide a reset signal to a microprocessor based computer that receives its input voltage from the output conductor of the series pass voltage regulator.

IN THE DRAWINGS

Figure 1:
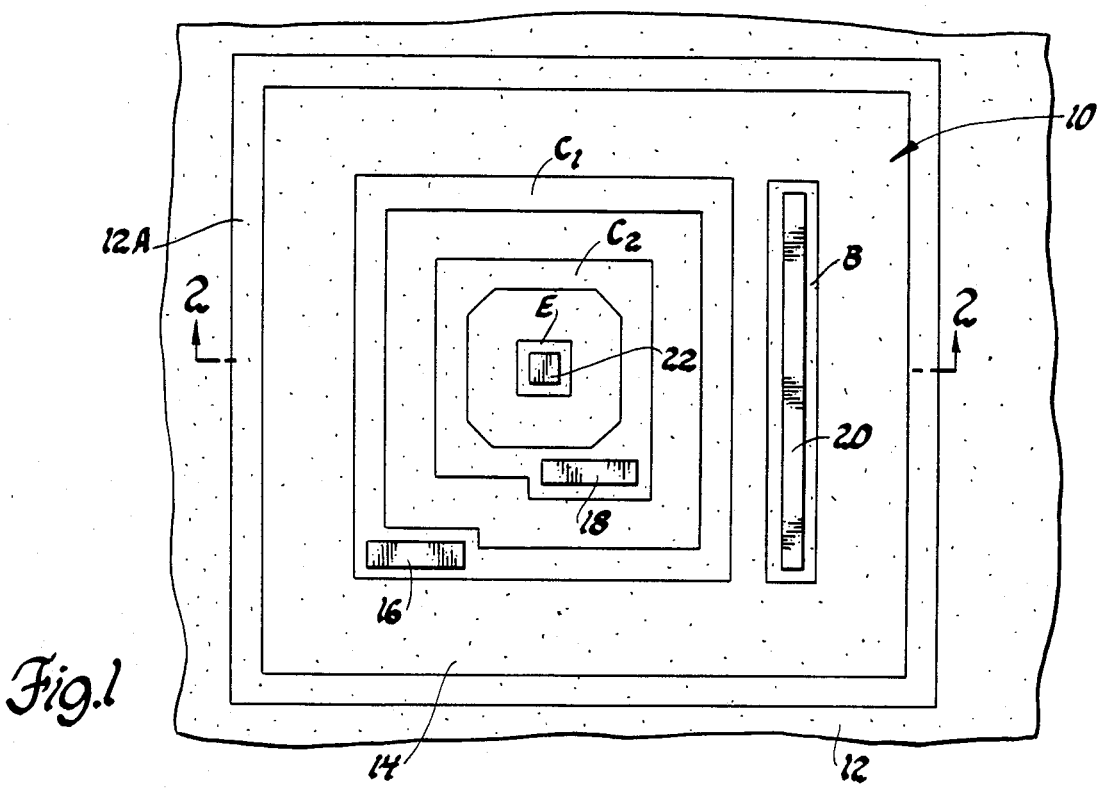
FIG. 1 is a plan view of a concentric collector PNP transistor made in accordance with this invention.
Figure 2:
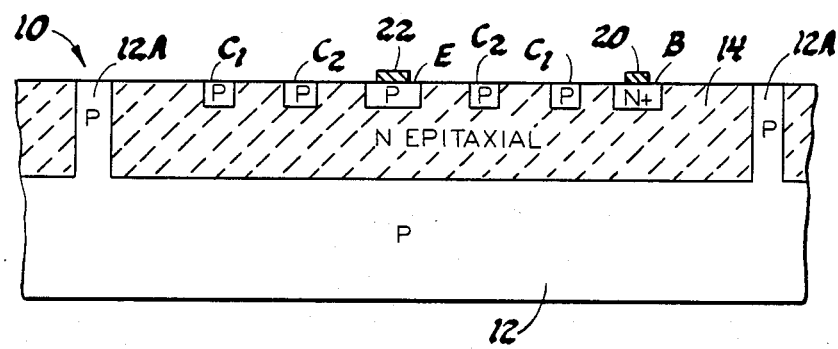
FIG. 2 is a sectional view taken along line 2—2 of FIG. 1.

Referring now to the drawings, FIGS. 1 and 2 illustrate the concentric collector PNP transistor of this invention that is used in the circuitry to be described. This transistor has been generally designated by reference numeral 10 and it has a substrate 12 that is formed of P-type semiconductor silicon material. The substrate 12 has a rectangular isolation region 12A formed of P-type material for isolating the transistor 10 from other parts of an integrated circuit that have not been illustrated. The transistor has a region 14 that is formed of N-type epitaxial material. Diffused into the region 14 is a rectangular region $C_1$ which is formed of P-type material. The region $C_1$ forms the outer collector for the transistor. A contact pad 16 (FIG. 1) formed of metallic material is electrically connected to the outer collector $C_1$. The transistor has another diffusion which forms an inner rectangular collector region or zone $C_2$. This inner collector or collector region $C_2$ is formed of P-type material. The inner collector $C_2$ is connected to a contact pad 18 illustrated in FIG. 1. The base of the transistor has been designated as B. This base or base region is formed by a diffusion of N+type material. The base B is connected to a contact pad 20. The emitter of the transistor is designated as E. It is formed by a diffusion of P−type material. The emitter or emitter region E is connected to a contact pad 22. It will be evident, from an inspection of FIG. 1, that the collectors $C_1$ and $C_2$ are rectangular and concentric. It will also be evident that the inner collector region $C_2$ entirely surrounds the emitter region E and that the outer collector region $C_1$ entirely surrounds the inner collector region $C_2$ and the emitter region E. The transistor 10 therefore may be characterized as a lateral concentric collector PNP transistor.

Figure 3:
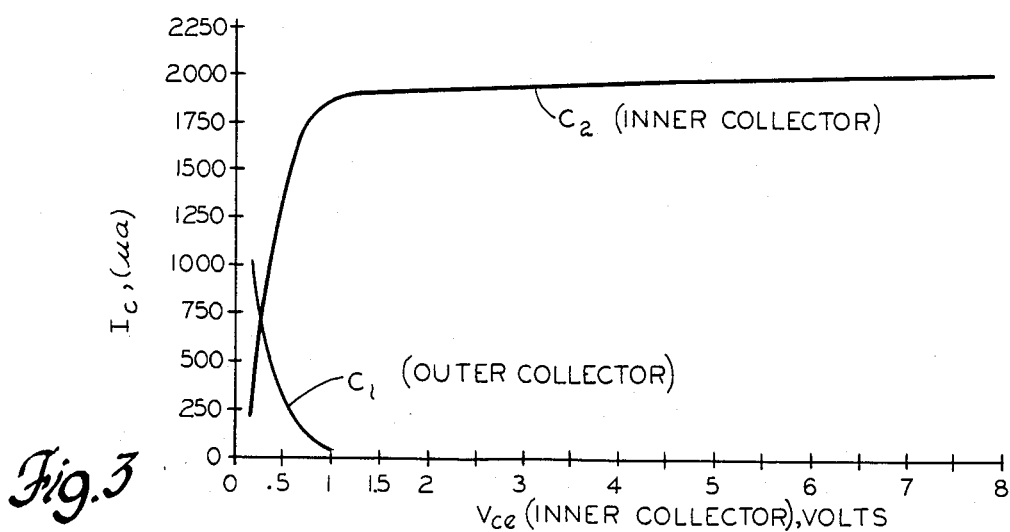
FIG. 3 illustrates collector voltage-current curves for the concentric collector transistor of this invention.

The voltage-current characteristics of the transistor 10 is illustrated in FIG. 3. In FIG. 3 collector current $I_c$ in $\mu a$ is plotted against collector-emitter voltage $V_{ce}$ of the inner collector $C_2$ in volts. The curve labeled $C_1$ relates to a plot of $I_c$ versus $V_{ce}$ (inner collector volts) for the outer collector $C_1$ of transistor 10 and the curve labeled $C_2$ relates to a plot of $I_c$ versus $V_{ce}$ (inner collector volts) for the inner collector $C_2$ of transistor 10. It can be seen from FIG. 3 that when $V_{ce}$ is reduced to less than 0.5 volts there is a dramatic drop in collector current of the inner collector $C_2$ and a sharp increase in the collector current of outer collector $C_1$. Maximum collector current of collector $C_1$ occurs at a $V_{ce}$ of about 0.2 volts. These changes in collector current of collectors $C_1$ and $C_2$ are caused by a parasitic action in which the collector current of inner collector $C_2$ instead of being shunted to ground, as happens with a conventional PNP transistor, is recollected by the outer collector $C_1$. As compared to a conventional PNP transistor the outer collector $C_1$ may be viewed as an extra "P" ring that serves to recollect the collector current that would be shunted to ground by a conventional PNP transistor where the inner collector $C_2$ would be the collector of such a conventional PNP transistor.

The outer collector curve $C_1$ of FIG. 3 shows a nearly proportional recollection of inner collector current and this characteristic can be utilized to trigger or turn on other circuitry. This characteristic can be used as an indicator of a saturated condition of transistor 10. The novel use of this characteristic will be described in connection with the systems illustrated in FIGS. 4 and 7.

Figure 4:
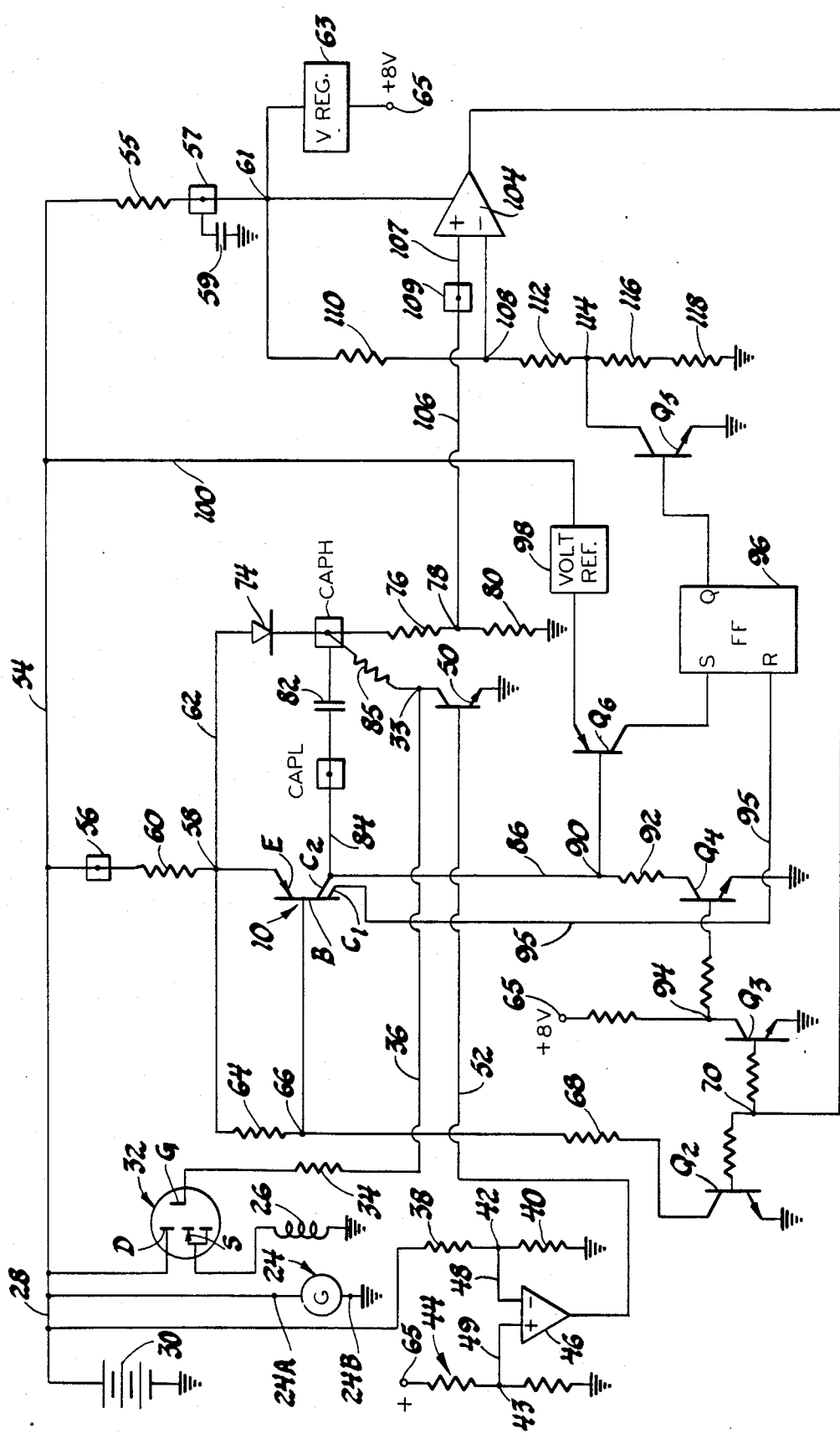
FIG. 4 is a schematic circuit diagram of a generator voltage regulator system that utilizes an oscillator-voltage doubler circuit made in accordance with this invention.

One novel use of the concentric collector PNP transistor 10 that has been described is illustrated in FIG. 4. In FIG. 4 the transistor 10 forms a component of an oscillator-voltage doubler that is utilized to drive a MOSFET (metal oxide field effect transistor) that forms a part of a generator voltage regulator. The transistor 10 is shown schematically in FIG. 4 where its inner collector is identified as $C_2$ and its outer collector as $C_1$. In FIG. 4 the emitter of transistor 10 is identified as E and its base as B.

The circuit of FIG. 4 illustrates a voltage regulating system for a motor vehicle electrical system which will be assumed to be a 12 volt system. In FIG. 4 the reference numeral 24 designates a direct voltage generator that has a rotor that is driven by the engine of the vehicle. The generator 24 is shown feeding a positive direct voltage output terminal 24A and a negative direct voltage output terminal 24B that is connected to ground. The direct voltage generator 24 is a three-phase alternating current generator having a three-phase stator winding (not illustrated) which is connected to a three-phase full-wave bridge rectifier (not illustrated) that has direct voltage output terminals connected to terminals 24A and 24B. The alternating current generator has a field winding 26.

The positive terminal 24A is connected to a conductor 28. A storage battery 30 is connected between conductor 28 and ground. Other motor vehicle loads are connected between conductor 28 and ground in a well known manner.

The field current of field winding 26 is controlled by an N-channel enhancement mode type of metal oxide semiconductor field effect transistor which is identified by reference numeral 32. The transistor 32 has a drain D that is connected to conductor 28 and a source S that is connected to one side of field winding 26. The opposite side of field winding 26 is grounded. The gate G of transistor 32 is connected to a junction or node 33 via a resistor 34 and a conductor 36.

The transistor 32 is biased conductive and nonconductive between its drain and source, depending upon the magnitude of the direct voltage appearing between conductor 28 and ground. In order to accomplish this a voltage sensing circuit is connected between conductor 28 and ground to sense the voltage across battery 30. This voltage sensing circuit comprises voltage divider resistors 38 and 40 having a junction 42. The voltage at junction 42 is a divided down representation of the voltage across battery 30 and it is compared with a reference voltage provided by a voltage divider 44. The voltage divider 44 is energized from a terminal or junction 65 that has a constant voltage applied thereto by a circuit that is described hereinafter. Junction 42 is connected to a voltage comparator 46 by conductor 48. Junction 43 of voltage divider 44 is connected to voltage comparator 46 by conductor 49. A substantially constant reference or set point voltage is applied to conductor 49 that is compared to the voltage at junction 42.

The output of voltage comparator 46 is applied to the base of an NPN transistor 50 via conductor 52. The emitter of transistor 50 is grounded and its collector is connected to junction 33. When the output of comparator 46 is high, transistor 50 is biased conductive to connect junction 33 to ground which lowers the voltage applied to the gate of transistor 32 to thereby cause transistor 32 to be biased nonconductive. When the output voltage of comparator 46 is low, transistor 50 is biased nonconductive. This will allow the voltage at junction 33, which is developed by the oscillator-voltage doubler of this invention, to bias transistor 32 conductive. Assuming a 12 volt system, the voltage regulator that has been described operates to maintain a desired regulated voltage of for example, 13.5 volts between conductor 28 and ground. Thus, as the voltage on conductor 28 goes above 13.5 volts transistor 32 is biased nonconductive to cut off field current to field winding 26 and when the output voltage of generator 24 now drops to a value such that the voltage at conductor 28 is below 13.5 volts, transistor 32 is biased conductive to supply field current to field winding 26. The transistor 32 therefore switches on and off to provide a field current that will cause the voltage generated by generator 24 to be maintained at a desired regulated value.

The conductor 28 is connected to a conductor 54. The conductor 54 is connected to a terminal or junction 56. The junction 56 is connected to a junction 58 through a 200 ohm resistor 60.

The conductor 54 is connected to one side of a 50 ohm resistor 55. The opposite side of resistor 55 is connected with a terminal 57. A capacitor 59 is connected between terminal 57 and ground. The terminal 57 is connected to a junction 61. The junction 61 feeds a conventional voltage regulating circuit 63. The output of circuit 63 is applied to a junction 65. Assuming a 12 volt system, the circuit 63 provides a constant voltage of 8 volts at junction 65. This junction 65 is connected to other junctions identified by reference numeral 65 by conductors that have not been illustrated.

The junction 58 is connected to the emitter of transistor 10 and to a conductor 62. The conductor 62 is connected to one side of a 10K ohm resistor 64. The opposite side of resistor 64 is connected to junction 66. A 41K ohm resistor 68 is connected between junction 66 and the collector of an NPN transistor $Q_2$. The emitter of transistor $Q_2$ is grounded and its base is connected to junction 70 and conductor 72. The base of the concentric collector transistor 10 is connected to junction 66.

A circuit is connected between conductor 62 and ground that includes in a series connection a diode 74, terminal or junction CAPH, a 114K ohm resistor 76, a junction 78 and a 57K ohm resistor 80. A 0.1 μf capacitor 82 is connected between junction CAPH and junction or terminal CAPL. The terminal CAPH is connected to junction 33 by a resistor 85. The junction CAPL is connected to the inside collector $C_2$ of transistor 10 by conductor 84. The conductor 84 is connected to a conductor 86 which in turn is connected to junction 90. A 150 ohm resistor 92 is connected between junction 90 and the collector of an NPN transistor $Q_4$. The emitter of transistor $Q_4$ is grounded. The base of transistor $Q_4$ is connected to a junction 94. The junction 94 is connected to the collector of a transistor $Q_3$ and to a junction 65. The junction 65 corresponds to the junction 65 connected to voltage regulating circuit 63. The emitter of transistor $Q_3$ is grounded and its base is connected to junction 70.

The system of FIG. 4 has a flip-flop 96 that has a set terminal S, a reset terminal R and an output terminal Q. The reset terminal R of flip-flop 96 is connected to the outside collector $C_1$ of transistor 10 by conductor 95. The set terminal S of flip-flop 96 is connected to the collector of a PNP transistor $Q_6$. The base of transistor $Q_6$ is connected to junction 90. A voltage of about 1.75 to 2.3 volts is applied to the emitter of transistor $Q_6$. This voltage is developed by a voltage reference circuit 98 that has an output connected to the emitter of transistor $Q_6$ and an input connected to conductor 54 via conductor 100.

The system of FIG. 4 has a voltage comparator 104 the output of which is connected to conductor 72. The positive input terminal of voltage comparator 104 is connected to junction 78 by a conductors 106 and 107 and a junction or conductive pad 109. The negative terminal of comparator 104 is connected to a junction 108. A resistive voltage divider is connected between junction 61 and ground that includes, in a series connection, a resistor 110 of 18.7K ohms, junction 108, a resistor 112 of 8K ohms, junction 114, resistor 116 of 2.88K ohms and resistor 118 of 10K ohms.

The junction 114 is connected to the collector of an NPN transistor $Q_5$. The emitter of transistor $Q_5$ is grounded and its base is connected to the Q output terminal of flip-flop 96.

The operation of the oscillator-voltage doubler of this invention will now be described. This oscillator voltage doubler does not include and does not require the circuit elements that provide the generator voltage regulator such as comparator 46 and transistor 50. This oscillator-voltage doubler is fabricated as an integrated circuit that has the previously described junctions or pads, 56, CAPL, CAPH, 57 and 109. The oscillator-voltage doubler provides a voltage at junction CAPH that is high enough to bias transistor 32 conductive. In this regard, it is pointed out that junction CAPH is connected to the gate G of transistor 32 via resistor 85, junction 33, conductor 36 and resistor 34. As will be described, the oscillator-voltage doubler develops a voltage at junction CAPH that is substantially twice or double the voltage on conductor 28. This voltage magnitude (double source voltage) is needed in order to assure that there is sufficient gate voltage for transistor 32 to bias it conductive and maintain it biased conductive. Thus, since transistor 32 is connected in a so-called high side drive configuration (load connected between source and ground) the voltage that is applied to its gate must be higher than the voltage that is applied to its drain in order to bias and maintain transistor 32 biased conductive and the oscillator-voltage doubler of this invention performs this function.

Figure 5A:
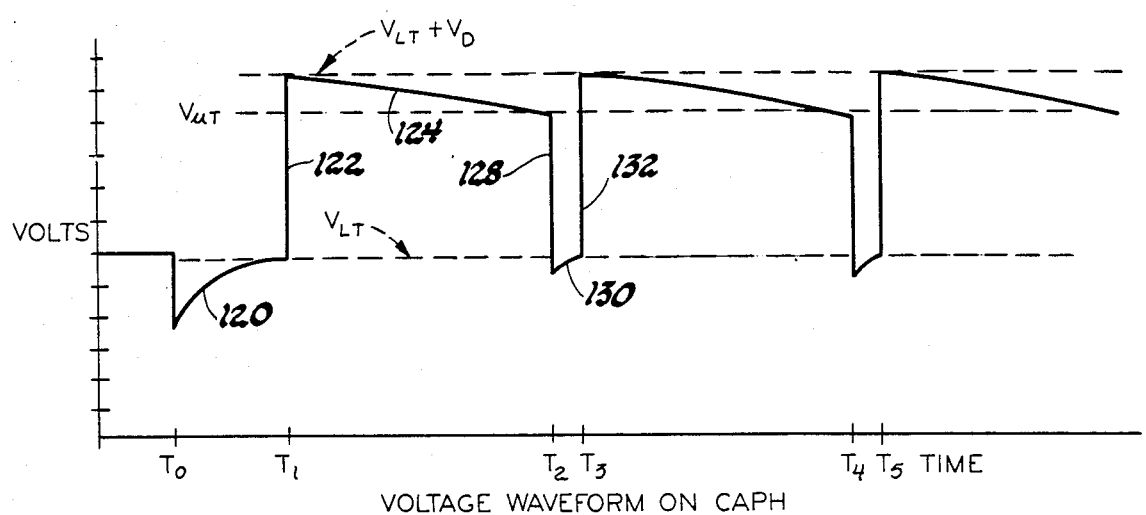
FIGS. 5A and 5B illustrate voltage waveforms that relate to the circuit illustrated in FIG. 4.
Figure 5B:
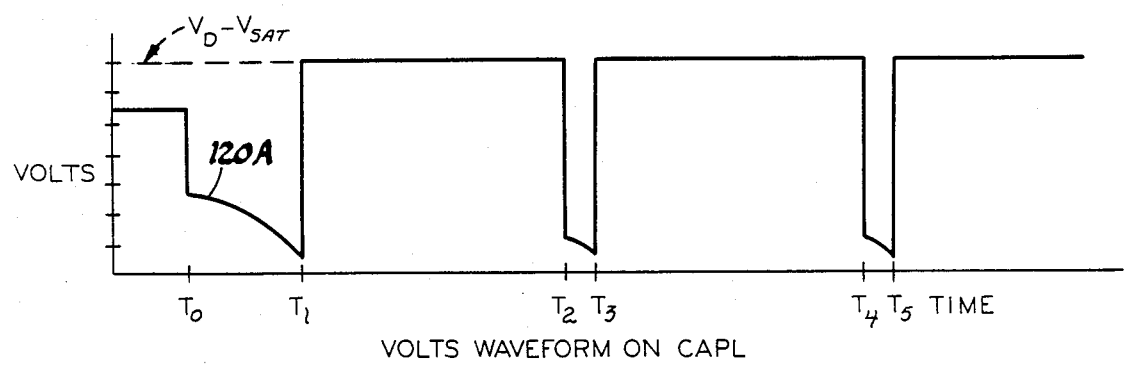
Figure 6:
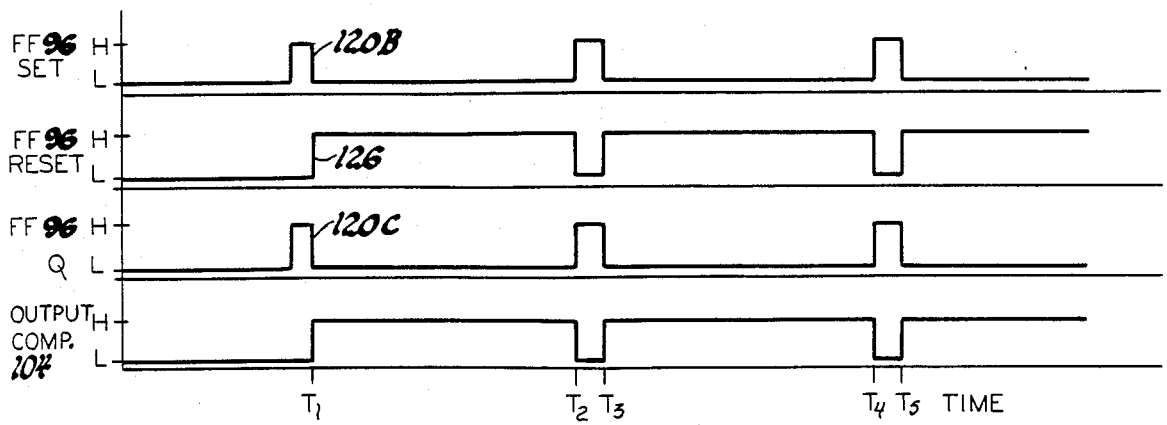
FIG. 6 illustrates voltages that relate to a flip-flop and a comparator that are components of the system illustrated in FIG. 4.

The operation of the oscillator-voltage doubler of this invention will now be described in detail with the aid of the voltage waveforms illustrated in FIGS. 5A and 5B and FIG. 6. FIG. 5A illustrates the voltage at junction CAPH and FIG. 5B illustrates the voltage at junction CAPL as a function of time. The voltage waveforms of FIG. 6 relate to flip-flop 96 and the output of comparator 104. At time $T_0$ transistor $Q_4$ is biased conductive. The capacitor 82 is now charged by the voltage on conductor 28 through a circuit that can be traced from conductor 28 to junction 58, through diode 74 to junction CAPH, through capacitor 82 and conductors 84 and 86 to junction 90 and then through resistor 92 and conductive transistor $Q_4$. As previously mentioned, the waveform of FIG. 5A illustrates the voltage on junction CAPH and FIG. 5B illustrates the voltage on junction CAPL. The voltage $V_D$, shown by legends in FIGS. 5A and 5B, represents the voltage at junction 58. The voltage level $V_D - V_{SAT}$ shown in FIG. 5B represents the voltage at junction 58 less the saturation voltage drop between the emitter E and inner collector $C_2$ of transistor 10. As capacitor 82 charges between times $T_0$ and $T_1$ the voltage at junction CAPH increases toward a direct voltage level $V_{LT}$ along line or curve 120. At the same time the voltage at junction CAPL decreases along line or curve 120A (FIG. 2B). At this time the output of comparator 104 is low and consequently transistors $Q_2$ and $Q_3$ are biased nonconductive. Since transistor $Q_2$ is biased nonconductive, transistor 10 is biased nonconductive and since transistor $Q_3$ is biased nonconductive transistor $Q_4$ is biased conductive. When the voltage at junction CAPL and hence at junction 90 drops to a predetermined value (about one $V_{be}$ below the emitter voltage of transistor $Q_6$) transistor $Q_6$ is biased conductive. When transistor $Q_6$ is biased conductive a set pulse 120B (FIG. 6) for flip-flop 96 is developed which causes a pulse 120C to be developed at the Q output of flip-flop 96. When pulse 120C is developed it biases the transistor $Q_5$ conductive. When transistor $Q_5$ is biased conductive it connects junction 114 to ground and hence the voltage at junction 108 is determined by a voltage divider comprised of series connected resistors 110 and 112. The comparator 104 compares the voltage at junction 108 with the voltage at junction 78 which is a divided down representation of the voltage at junction CAPH. The system is arranged such that when the voltage at junction CAPH reaches the level $V_{LT}$ (FIG. 5A) the output of comparator 104 switches from a low level to a high level. The pulse 120C will always occur prior to the time that voltage 120 (FIG. 5A) reaches the level $V_{LT}$.

When the voltage 120 (FIG. 5A) does reach the $V_{LT}$ level at time $T_1$ the output of comparator 104 goes high to bias transistors $Q_2$ and $Q_3$ conductive. The conduction of transistor $Q_3$ will cause transistor $Q_4$ to be biased nonconductive and the conduction of transistor $Q_2$ causes concentric collector transistor 10 to be biased conductive. When transistor 10 is biased conductive and $Q_4$ is biased nonconductive the voltage at junction CAPH increases abruptly along line 122 (FIG. 5A) to a level that is equal to $V_{LT}+V_D$ where the voltage $V_D$ is the voltage at junction 58 and where the saturation voltage drop of transistor 10 between its emitter E and inside collector $C_2$ has been neglected. The reason for this abrupt increase is that the positive voltage at junction 58 has now been added in series with the voltage across capacitor 82. In this regard it should be noted that there is only a small voltage drop across resistor 60 so that voltage $V_D$ is near the voltage of conductor 28. The addition of voltage $V_D$ to the voltage across the capacitor 82 takes place because at this time transistor 10 is conducting between its emitter E and its inside collector $C_2$. The voltage level $V_{LT}+V_D$ is high enough to bias transistor 32 to a conductive condition and maintain it biased to this condition. The voltage level $V_{LT}+V_D$ is about double or twice the voltage $V_D$ and hence the circuit operates as a voltage doubler.

At time $T_1$ when transistor $Q_4$ is biased nonconductive the abrupt voltage transition 122 will occur and the capacitor 82 will then start to discharge through resistors 76 and 80. At the end of voltage transition 122 the voltage at junction CAPH is $V_{LT}+V_D$ and transistor 10 is biased conductive. At this time the voltage at the inside collector $C_2$ of transistor 10 has risen to the highest potential possible, its saturated state, which is within 0.2 volts of voltage $V_D$. This voltage is applied to the most negative side of capacitor 82, which has been previously charged to potential $V_{LT}$ and thus is added to it based on the principal of charge conservation. The sum of these voltages ($V_{LT}+V_D$) appear at CAPH and is well in excess of voltage level $V_{UT}$. With the inside collector $C_2$ at the voltage that has just been described the outside collector $C_1$ begins to source current and as a result, current is supplied to the reset terminal R of flip-flop 96 via line 95 to cause the flip-flop to reset. This reset function is illustrated as voltage transistion 126 in FIG. 6. The reason that outside collector $C_1$ sources current when the voltage of the inside collector is raised to the voltage that has been described is as previously explained. That is, the inner collector $C_2$ ceases to be capable of collecting the current injected by the emitter because of its high bias voltage. The outside collector $C_1$ detects this saturated condition and assumes the role of collecting the excess current which is then available to provide the reset signal. This role reversal action (as a function of voltage) is shown in FIG. 3. Now as the capacitor 82 discharges the voltage $V_{LT}+V_D$ (FIG. 5A) decreases along line 124 toward a voltage level $V_{UT}$ illustrated in FIG. 5A. The voltage level $V_{UT}$ may be about 10% less than the voltage $V_{LT}+V_D$.

When flip-flop reset voltage transition 126 occurs, the Q output of flip-flop 96 goes low and accordingly transistor $Q_5$ is biased nonconductive. When transistor $Q_5$ is biased nonconductive the voltage at junction 108 increases as compared to the voltage at junction 108 when transistor $Q_5$ is conductive. Thus, when transistor $Q_5$ is biased nonconductive, the voltage at junction 108 is determined by a voltage divider that is comprised of series connected resistors 110, 112, 116 and 118. When transistor $Q_5$ is biased nonconductive, the voltage at junction 108 will exceed the voltage at junction 78 and accordingly the output of comparator 104 will go high. The resistors 110, 112, 116 and 118 form a switchable voltage divider that has a voltage divider ratio that depends upon whether transistor $Q_5$ is biased conductive or nonconductive.

From the foregoing it will be apparent that at the end of voltage transition 122 transistor $Q_5$ has been biased nonconductive and the output of comparator 104 has switched from a low state to a high state.

When the output of comparator 104 goes high transistor 10 is biased conductive and transistor $Q_4$ nonconductive. Accordingly, the capacitor 82 no longer charges and it begins to discharge as has been described. As capacitor 82 discharges the voltage at junction CAPH decreases along line 124 of FIG. 5A. When this voltage decreases below the level $V_{UT}$ at time $T_2$ the output of comparator 104 goes low. In regard to the voltage level $V_{UT}$ it should be noted that a divided down representation of the voltage at CAPH appears at junction 78. This voltage is compared with the voltage at junction 108 and the voltage at junction 108 is of such a magnitude that when the voltage at CAPH drops below $V_{UT}$ the output of comparator 104 goes low.

When the output of comparator 104 goes low at time $T_2$ transistor 10 is biased nonconductive and transistor $Q_4$ is biased conductive. The voltage at CAPH now experiences an abrupt negative transition 128 (FIG. 5A) due to the fact that transistor 10 has been biased nonconductive while transistor $Q_4$ is biased conductive. With transistor $Q_4$ biased conductive, transistor $Q_6$ becomes biased conductive when the voltage transition 128 drops below approximately one $V_{be}$ of the voltage appearing at the emitter of $Q_6$ which biases transistor $Q_6$ conductive to cause the Q output of flip-flop 96 to go high thereby biasing transistor $Q_5$ conductive. With transistor $Q_5$ biased conductive, the voltage divider ratio of the resistors that determine the voltage at junction 108 is changed so that the voltage at junction 108 decreases as compared to the condition where transistor $Q_5$ is nonconductive. Since transistor $Q_4$ is now conductive capacitor 82 is charged between time periods $T_2$ and $T_3$. The voltage at CAPH now increases along line 130 (FIG. 5A) and when this voltage attains level $V_{LT}$ the output of comparator 104 goes low. This causes transistor 10 to be biased conductive with the result that the voltage at CAPH makes another abrupt positive transition 132. The system now continues to operate through consecutive cycles in a manner that has been described.

The oscillator-voltage doubler is a free running oscillator and a voltage doubler. Thus, the frequency of the voltage waveform shown in FIG. 5A is constant and is determined by the values of capacitor 82 and resistors 60, 76 and 80. The time periods that correspond to time periods $T_1$ to $T_3$ and $T_3$ to $T_5$ are substantially equal. The circuit also operates as a voltage doubler in a manner that has been described. Thus, the input voltage is doubled at, for example at times $T_1$ and $T_3$. Moreover, during time periods such as $T_1$ to $T_2$ and $T_3$ to $T_4$ the voltage at CAPH remains high enough to maintain transistor 32 biased conductive and even when this voltage decreases slightly to the level $V_{UT}$ it still is of a magnitude that is nearly double the input voltage.

As previously mentioned, at time $T_1$ the voltage at CAPH makes the abrupt transition 122 and rises to the level $V_{LT}+V_D$. It should be noted, however, that the next desired event (at time $T_2$) is when the CAPH voltage decays down to the level $V_{UT}$. It is important to charge the capacitor 82 to a level above $V_{UT}$ such that it can decay down to this level to trigger the next event at time $T_2$. It is also important that the circuit not trigger at voltage level $V_{UT}$ during the short time when the capacitor voltage is being doubled and is initially increasing or crossing through voltage level $V_{UT}$ (voltage transition 122). False triggering at this point (voltage transition 122) would either cause a circuit malfunction or an undesirable system glitch. This means that the comparator threshold (voltage at junction 108) must remain at a level that is a divided down representation of $V_{LT}$ until the CAPH voltage level is well above $V_{UT}$. The concentric collector transistor 10 of this invention reliably performs this function by sourcing current at the outside collector $C_1$ when the voltage at its inner collector $C_2$ rises to a voltage that is within 0.2 volts of the maximum capacitor charging voltage $V_D$.

By utilizing the concentric collector transistor 10 in a manner that has been described, there is no need to provide a voltage comparator in addition to comparator 104 that would sense a voltage level somewhere between $V_{UT}$ and $V_{LT}+V_D$ and reset a flip-flop like flip-flop 96 to change the voltage divider ratio that determines the voltage at junction 108. By eliminating the need for an additional comparator, silicon area to fabricate an integrated circuit is reduced and circuit sensitivities and variations associated with an additional comparator are eliminated.

In the oscillator-voltage doubler that has been described, the concentric collector transistor 10 performs a dual function. First of all, it sources a current when it is biased conductive, or putting it another way, it dynamically connects the positive voltage on conductor 28 to junction CAPL. This means that the emitter E and the inside collector $C_2$ form a conductive circuit that connects the direct voltage between conductor 28 and ground in series with the voltage across capacitor 82. These added voltages supply gate-source current to transistor 32. The other function performed by concentric collector transistor 10 is that it operates as a voltage comparator. Thus, transistor 10 compares the voltage on its emitter E with the voltage on its inner collector $C_2$ and when the voltage on collector $C_2$ is about 0.2 volts less than the voltage on emitter E an output signal or current is developed at its outer collector $C_1$.

Figure 7:
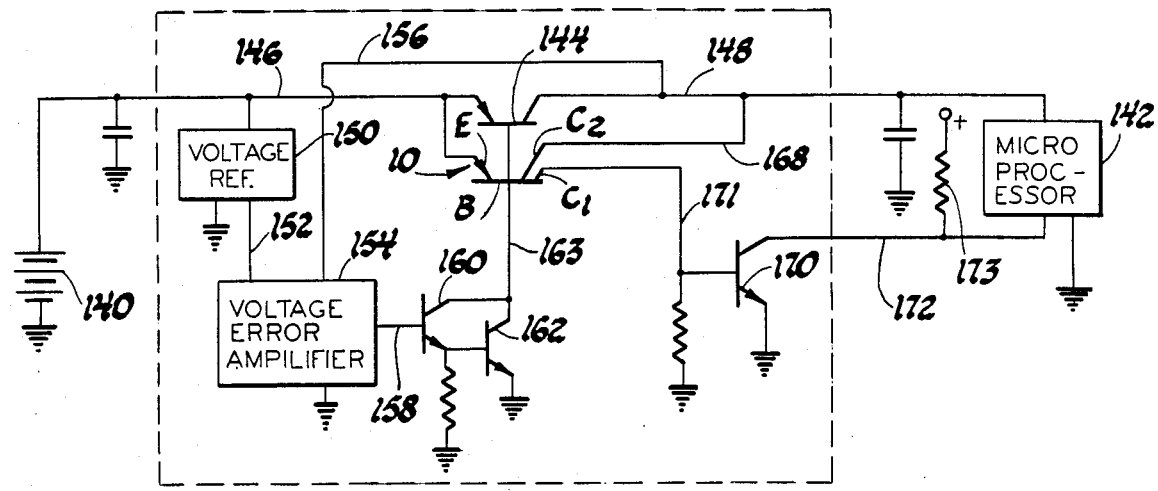
FIG. 7 is a schematic circuit diagram of a voltage regulator that utilizes a concentric collector transistor made in accordance with this invention.

Referring now to FIG. 7, another use for the concentric collector transistor 10 will be described. In FIG. 7 the reference numeral 140 identifies a source of direct input voltage which has been illustrated as a battery. The source 140 may be a motor vehicle battery that is supplied with charging current by a battery charging generator in a manner illustrated in FIG. 1. The direct voltage source 140 feeds a microprocessor-based computer 142 through a series pass voltage regulator that includes PNP transistor 144. The computer 142 may be an engine control computer.

The emitter of transistor 144 is connected to the positive side of voltage source 140 by a conductor 146. The collector of transistor 144 is connected to conductor output 148 which feeds the computer 142. The voltage regulator has a voltage reference developing circuit 150 connected between conductor 146 and ground. The circuit 150 develops a constant reference voltage on conductor 152 which is applied as an input to a voltage error amplifier 154. The error amplifier 154 has another input connected to conductor 148 via conductor 156. The error amplifier 154 has an output on line 158 which controls the conduction of NPN transistors 160 and 162. The collectors of these transistors are connected to the base of transistor 144 by a conductor 163.

The voltage regulator operates to maintain a substantially constant regulated output voltage on output conductor 148 that is lower than the input voltage applied to conductor 146. The error amplifier compares the reference voltage on line 152 with the output voltage on conductor 148. When the voltage on conductor 148 is higher than the desired regulated value the conduction of transistors 160 and 162 is reduced which causes the emitter-collector current of transistor 144 to be reduced. When the voltage on conductor 148 goes below the desired regulated value the conduction of transistors 160 and 162 is increased which causes an increase in emitter-collector current of transistor 144. By way of example, in a 12 volt system where the input voltage is about 12 volts the regulated output voltage on conductor 148 may be, under normal conditions, maintained at about 5 volts.

Figure 9A:
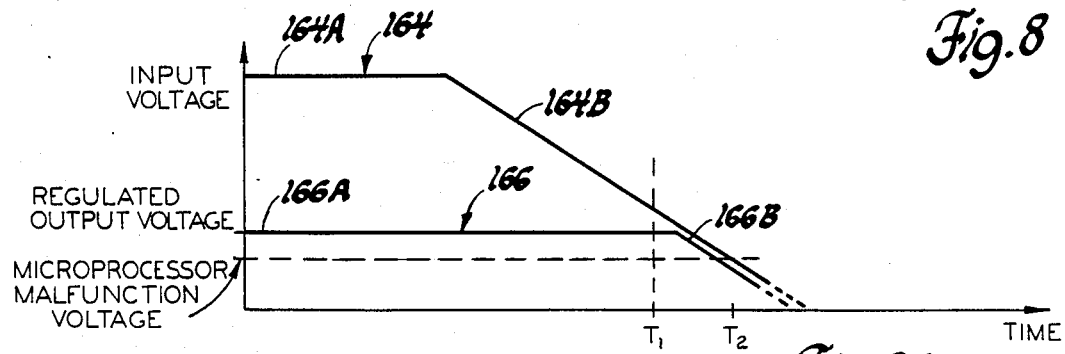
FIGS. 9A and 9B illustrate waveforms that relate to the circuit of FIG. 7.

FIG. 9A illustrates the input voltage 164 on line 146 and the regulated output voltage 166 that appears on line 148 plotted against time. The dotted line in FIG. 9A represents a microprocessor malfunction voltage level. If the voltage on output conductor 148 drops below the malfunction voltage level the microprocessor 142 will malfunction.

As previously described, the line 164 in FIG. 9A depicts the input voltage on conductor 146. Straight line portion 164A of line 164 illustrates a normal input voltage and portion 164B illustrates the input voltage decreasing to zero. The regulated output voltage on conductor 148 is illustrated as a line 166 having a straight portion 166A and a portion 166B that depicts a decreasing regulated output voltage.

Assume now that the input voltage starts to decrease along line 164B. At time $T_1$ the input voltage which is decreasing along line 164B is just slightly higher than the regulated output voltage represented by line 166A. This condition is indicative of an impending low voltage condition and must be detected in order to provide a reset signal for the microprocessor 142. In order to accomplish this the circuit of FIG. 7 utilizes the concentric collector transistor 10 which has been described in connection with FIGS. 1–3. In FIG. 7 the emitter E of transistor 10 is connected to conductor 146. The base B of transistor 10 is connected to the collectors of transistors 160 and 162 and to the base of transistor 144. The inner collector $C_2$ of transistor 10 is connected to conductor 148 by a conductor 168. The outside collector $C_1$ of transistor 10 is connected to the base of an NPN transistor 170 by a conductor 171. The emitter of transistor 170 is grounded and its collector is connected to microprocessor 142 by conductor 172. The conductor 172 is connected to a source of positive voltage by a resistor 173.

Since the emitter E and inner collector $C_2$ of transistor 10 are connected between conductors 146 and 148 and since the base B of transistor 10 is connected to the collectors of transistors 160 and 162 the conduction of transistor 10 between its emitter E and inner collector $C_2$ will be controlled by the error amplifier 154 in the same manner that it controls the conduction of transistor 144. Most of the load current for microprocessor 142 will be supplied through transistor 144. Some load current will be supplied through the emitter E to collector $C_2$ current path of transistor 10.

Figure 9B:
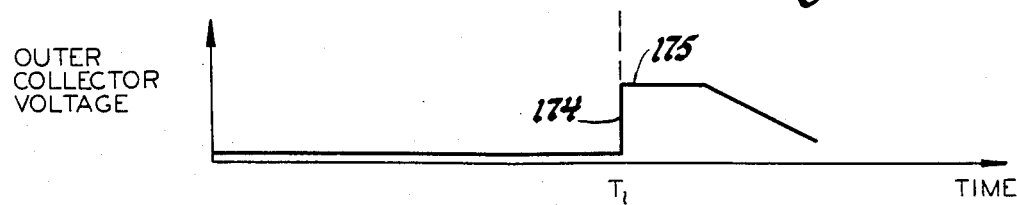

Referring again to FIG. 9A, let it be assumed that the input voltage on conductor 146 has decreased along line 164B such that at time $T_1$ it is only slightly higher than the regulated output voltage depicted by line 166A. During this condition of operation the voltage on the inner collector $C_2$ of transistor 10 is close to the voltage of the emitter E of transistor 10 and because of this an output voltage is developed at the outside collector $C_1$ of transistor 10. The output voltage of the outside collector $C_1$ of transistor 10 is depicted in FIG. 9B. At time $T_1$ this output voltage makes a positive transition 174 due to the fact that the input voltage is close to the output voltage. The voltage transistion 174 and attained voltage level 175 will cause the transistor 170 to be biased conductive which applies a low level reset signal to microprocessor 142 via line 172.

The time $T_2$ in FIG. 9A is indicative of a point in time where the input voltage will eventually drop below the microprocessor malfunction voltage level.

Figure 8:
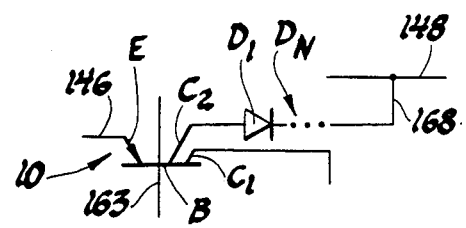
FIG. 8 illustrates a modification of a part of the circuit illustrated in FIG. 7.

The minimum voltage (voltage between E and $C_2$ of transistor 10) at which a reset signal is produced at collector $C_1$ may be increased by adding one or more diodes $D_1$-$D_N$ in series with the inside collector $C_2$, as illustrated in the modification of FIG. 8. Because of the additional diode voltage drop or drops the transistor 10 will saturate at a correspondingly higher input voltage. In this way the time $T_2-T_1$ may be increased, thus giving the microprocessor additional time to perform its final tasks before power down.

At the expense of some reiteration it will be appreciated that the circuit of FIG. 7 provides a reset signal on line 172 when a low input voltage is impending. By producing this reset signal before the input voltage drops below the microprocessor malfunction voltage level the microprocessor has enough time to perform its final "housekeeping" tasks before the input voltage drops below the malfunction level. These so-called housekeeping tasks include storing vital parameters in non-volatile memory, issuing default commands, activating system back-up circuits, etc.

The embodiments of the invention in which an exclusive property or privilege is claimed are defined as follows:

1. An electrical system comprising, a source of direct voltage having positive and negative terminals, means connecting said positive terminal of said source to a first conductor means, a lateral PNP transistor having a base region, an emitter region, an inner collector region completely bounding said emitter region and an outer collector region completely bounding said inner collector region and said emitter region, said outer collector region providing an output current when the voltage applied to said inner collector region is slightly lower by a predetermined magnitude than the voltage applied to said emitter region, means connecting said emitter region to said first conductor means, means connecting said base region to said voltage source in such a manner as to cause said transistor to conduct between said emitter region and said inner collector region, means connecting said inner collector region to a second conductor means, said second conductor means being energized by said source of voltage, and means connected to said outside collector region for providing a signal when the voltage of said second conductor means has a magnitude that is slightly lower than the voltage of said first conductor means by said predetermined magnitude.

2. The electrical system according to claim 1 where the said predetermined magnitude is less than 0.5 volts.

3. An oscillator-voltage doubler comprising, a source of direct voltage having positive and negative terminals, a lateral PNP transistor having an emitter, an inner collector located adjacent the emitter and an outer collector located outwardly of said inner collector, a capacitor, a semiconductor switch connected in series with said capacitor and in series with said source of voltage, said capacitor being charged from said voltage source when said semiconductor switch is biased conductive and being allowed to discharge when said semiconductor switch is biased nonconductive, means connecting said emitter of said transistor to the positive terminal of said source of voltage, means connecting said capacitor between said inner collector of said transistor and a junction, means responsive to the voltage at said junction for biasing said transistor conductive and said semiconductor switch nonconductive when the voltage of said junction attains a first predetermined magnitude due to capacitor charging, the emitter-inner collector circuit of said transistor when biased conductive connecting the voltage of said source and the voltage of the capacitor in series whereby the voltage at said junction abruptly increases to a second predetermined magnitude that is a function of the sum of the voltage of said voltage source and the voltage of said capacitor, said transistor operative when the voltage at its inner collector is slightly below the voltage of its emitter to develop a signal at the outer collector of said transistor, means responsive to the development of said signal for developing a threshold voltage that corresponds to a third voltage magnitude at said junction that is higher than said first predetermined magnitude and lower than said second predetermined magnitude, and means responsive to said threshold voltage and the voltage at said junction for biasing said transistor nonconductive and said semiconductor switch conductive when the voltage at said junction decreases to said third predetermined magnitude during discharge of said capacitor.

4. An oscillator-voltage doubler comprising, a source of direct voltage having positive and negative terminals, a lateral PNP transistor having an emitter, an inner collector located adjacent the emitter and an outer collector located outwardly of said inner collector, a capacitor, a semiconductor switch connected in series with said capacitor and in series with said source of voltage, said capacitor being charged from said voltage source when said semiconductor switch is biased conductive and being allowed to discharge when said semiconductor switch is biased nonconductive, means connecting said emitter of said transistor to the positive terminal of said source of voltage, means connecting said capacitor between said inner collector of said transistor and a junction, means responsive to the voltage at said junction for biasing said transistor conductive and said semiconductor switch nonconductive when the voltage of said junction attains a first predetermined magnitude due to capacitor charging, the emitter-inner collector circuit of said transistor when biased conductive connecting the voltage of said source and the voltage of the capacitor in series whereby the voltage at said junction abruptly increases to a second predetermined magnitude that is a function of the sum of the voltage of said voltage source and the voltage of said capacitor, said transistor operative when the voltage at its inner collector is slightly below the voltage of its emitter to develop a signal at the outer collector of said transistor, means including voltage divider means responsive to the development of said signal for developing a threshold voltage that corresponds to a third voltage magnitude at said junction that is higher than said first predetermined magnitude and lower than said second predetermined magnitude, and voltage comparator means responsive to said threshold voltage and the voltage at said junction for biasing said transistor nonconductive and said semiconductor switch conductive when the voltage at said junction decreases to said third predetermined magnitude during discharge of said capacitor.

5. An oscillator-voltage doubler comprising, a source of direct voltage having positive and negative terminals, a lateral PNP transistor having an emitter, an inner collector located adjacent the emitter and an outer collector located outwardly of said inner collector, a capacitor, a semiconductor switch connected in series with said capacitor and in series with said source of voltage, said capacitor being charged from said voltage source when said semiconductor switch is biased conductive and being allowed to discharge when said semiconductor switch is biased nonconductive, means connecting said emitter of said transistor to the positive terminal of said source of voltage, means connecting said capacitor between said inner collector of said transistor and a first junction, a first voltage divider connected to said first junction having a second junction the voltage of which is a divided down representation of the voltage at said first junction, a voltage comparator responsive to the voltage at said second junction for biasing said transistor conductive and said semiconductor switch nonconductive when the voltage of said first junction attains a first predetermined magnitude due to capacitor charging, the emitter-inner collector circuit of said transistor when biased conductive connecting the voltage of said source and the voltage of the capacitor in series whereby the voltage at said first junction abruptly increases to a second predetermined magnitude that is a function of the sum of the voltage of said voltage source and the voltage of said capacitor, said transistor operative when the voltage at its inner collector is slightly below the voltage of its emitter to develop a signal at the outer collector of said transistor, and means including a second voltage divider responsive to the development of said signal for developing a threshold voltage at a third junction of said second voltage divider that corresponds to a third voltage magnitude at said first junction that is higher than said first predetermined magnitude and lower than said second predetermined magnitude, said voltage comparator connected to said second and third junctions and operative to bias said transistor nonconductive and said semiconductor switch conductive when the voltage at said first junction decreases to said third predetermined magnitude during discharge of said capacitor.

6. An oscillator-voltage doubler comprising, a source of direct voltage having positive and negative terminals, a lateral PNP transistor having an emitter, an inner collector located adjacent the emitter and an outer collector located outwardly of said inner collector, a capacitor, a semiconductor switch connected in series with said capacitor and in series with said source of voltage, said capacitor being charged from said voltage source when said semiconductor switch is biased conductive and being allowed to discharge when said semiconductor switch is biased nonconductive, means connecting said emitter of said transistor to the positive terminal of said source of voltage, means connecting said capacitor between said inner collector of said transistor and a junction, means responsive to the voltage at said junction for biasing said transistor conductive and said semiconductor switch nonconductive when the voltage of said junction attains a first predetermined magnitude due to capacitor charging, the emitter-inner collector circuit of said transistor when biased conductive connecting the voltage of said source and the voltage of the capacitor in series whereby the voltage at said junction abruptly increases to a second predetermined magnitude that is a function of the sum of the voltage of said voltage source and the voltage of said capacitor, said transistor operative when the voltage at its inner collector is slightly below the voltage of its emitter to develop a signal at the outer collector of said transistor, means including a switchable voltage divider means that is switchable between at least two voltage divider ratios responsive to the development of said signal for developing a threshold voltage at a junction of said voltage divider means that corresponds to a third voltage magnitude at said junction that is higher than said first predetermined magnitude and lower than said second predetermined magnitude, and means responsive to said threshold voltage and the voltage at said junction for biasing said transistor nonconductive and said semiconductor switch conductive when the voltage at said junction decreases to said third predetermined magnitude during discharge of said capacitor.

7. A voltage regulator comprising, a source of direct voltage having positive and negative terminals, an input conductor connected to said positive terminal, an output conductor adapted to be connected to an electrical load, control means connected between said input conductor and said output conductor and responsive to the voltage at said output conductor for maintaining the voltage at said output conductor substantially constant, a lateral PNP transistor having an emitter, an inner collector located adjacent the emitter and an outer collector located outwardly of said inner collector, said transistor operative to develop an output signal at its outer collector when the voltage of its emitter is slightly higher by a predetermined magnitude than the voltage of its inner collector, means connecting said emitter to said input conductor, means connecting said inner collector to said output conductor, and means for biasing said transistor conductive whereby when said transistor is biased conductive and the input voltage applied to said input conductor drops to a value that is higher than the voltage on said output conductor by said predetermined magnitude a signal is developed at said outer collector.

8. A voltage regulator comprising, a source of direct voltage having positive and negative terminals, an input conductor connected to said positive terminal, an output conductor adapted to be connected to an electrical load, control means connected between said input conductor and said output conductor and responsive to the voltage at said output conductor for maintaining the voltage at said output conductor substantially constant and at a magnitude that is lower than the voltage of said voltage source by a first predetermined magnitude, a lateral PNP transistor having an emitter, an inner collector located adjacent the emitter and an outer collector located outwardly of said inner collector, said transistor operative to develop an output signal at its outer collector when the voltage of its emitter is slightly higher by a second predetermined magnitude than the voltage of its inner collector, said second predetermined magnitude being less than said first predetermined magnitude, means connecting said emitter to said input conductor, means connecting said inner collector to said output conductor, and means for biasing said transistor conductive whereby when said transistor is biased conductive and the input voltage applied to said input conductor drops to a value that is higher than the voltage on said output conductor by said second predetermined magnitude a signal is developed at said outer collector.

9. A voltage regulator comprising, a source of direct voltage having positive and negative terminals, an input conductor connected to said positive terminal, an output conductor adapted to be connected to an electrical load, a PNP transistor having its emitter and collector connected between said input conductor and said output conductor, control means connected to the base of said PNP transistor and responsive to the voltage at said output conductor for controlling the conduction of said transistor to PNP maintain the voltage at said output conductor substantially constant and at a magnitude that is lower than the voltage of said voltage source by a first predetermined magnitude, and a lateral PNP transistor having an emitter, an inner collector located adjacent the emitter and an outer collector located outwardly of said inner collector, said lateral PNP transistor operative to develop an output signal at its outer collector when the voltage of its emitter is slightly higher by a second predetermined magnitude than the voltage of its inner collector, said second predetermined magnitude being less than said first predetermined magnitude, means connecting said emitter of said lateral PNP transistor to said input conductor, means connecting said inner collector of said lateral PNP transistor to said output conductor, means connecting said base of said lateral PNP transistor to said control means, said lateral PNP transistor when biased conductive by said control means operative to develop a signal at its outer collector when the input voltage applied to said input conductor drops to a value that is higher than the voltage on said output conductor by said second predetermined magnitude.

* * * * *